United States Patent [19]

Oakley

[11] Patent Number: 5,065,068

[45] Date of Patent: Nov. 12, 1991

[54] FERROELECTRIC CERAMIC TRANSDUCER

[76] Inventor: Clyde G. Oakley, 431 Summit Dr., Lewistown, Pa. 17044

[21] Appl. No.: 624,209

[22] Filed: Dec. 7, 1990

Related U.S. Application Data

[63] Continuation-in-part of Ser. No. 363,063, Jun. 6, 1989, abandoned.

[51] Int. Cl.⁵ .................................... H01L 41/08
[52] U.S. Cl. ............................ 310/357; 310/334; 310/337
[58] Field of Search ...................... 310/334–337, 310/358, 359, 366–369

[56]  References Cited

U.S. PATENT DOCUMENTS

| | | | |
|---|---|---|---|
| 2,797,399 | 6/1957 | Camp et al. | 310/337 |
| 2,831,175 | 4/1958 | Janssen et al. | 310/358 |
| 3,470,394 | 9/1969 | Cook et al. | 310/367 |
| 3,833,825 | 9/1974 | Haan | 310/9.5 |
| 4,371,805 | 2/1983 | Diepers et al. | 310/334 |
| 4,390,976 | 6/1983 | Eynck | 367/153 |
| 4,412,148 | 10/1983 | Klicker | 310/358 |
| 4,422,003 | 12/1983 | Safari et al. | 310/358 |
| 4,518,889 | 5/1985 | 'T Hoen | 310/357 |
| 4,613,784 | 9/1986 | Haun et al. | 310/358 |
| 4,616,152 | 10/1986 | Saito et al. | 310/334 |
| 4,628,223 | 12/1986 | Takeuchi et al. | 310/358 |
| 4,640,291 | 2/1987 | 'T Hoen | 128/660 |
| 4,671,293 | 6/1987 | Shaulov | 128/660 |
| 4,672,591 | 6/1987 | Breimesser | 367/152 |
| 4,683,396 | 7/1987 | Takeuchi et al. | 310/358 |
| 4,728,845 | 3/1988 | Haun et al. | 310/358 |
| 4,747,192 | 5/1988 | Rokurota | 29/25 |
| 4,801,835 | 1/1989 | Nakaya et al. | 310/358 |
| 4,803,392 | 2/1989 | Koshida et al. | 310/311 |
| 4,869,768 | 9/1989 | Zola | 156/245 |

OTHER PUBLICATIONS

"Transient Performances of Three Composite-Ceramic Ultrasonic Tranducers", by R. H. Coursant—M. Gauchet, Feb. 3, 1982.

Primary Examiner—Mark O. Budd
Attorney, Agent, or Firm—Ratner & Prestia

[57]  ABSTRACT

A ferroelectric ceramic transducer having low density, high compliance and improved electrical properties achieved by the absence of any solid or liquid material in the spaces between the lateral sides of the ferroelectric ceramic posts of the transducer. The ceramic volume-fill of the posts is no greater than sixty percent.

19 Claims, 2 Drawing Sheets

FERROELECTRIC CERAMIC TRANSDUCER

RELATED APPLICATION

This application is a continuation-in-part of application Ser. No. 363,063 filed on June 6, 1989 now abandoned, and entitled "Piezoelectric Device With Air-Filled Kerf."

FIELD OF THE INVENTION

This invention relates, in general, to ferroelectric devices and, in particular, to piezoelectric and relaxor ferroelectric transducers having application in ultrasound transmission and reception.

DESCRIPTION OF THE PRIOR ART

U.S. Pat. No. 4,412,148 discloses a PZT-polymer composite fabricated so that an array of parallel PZT strands or rods are embedded in a mechanically compliant matrix of a polymer, such as an epoxy.

U.S. Pat. No. 4,613,784 discloses a PZT glass polymer composite material of 1-2-3 connectivity made from a plurality of generally parallel PZT rods aligned in the direction of a poling electric field secured in the matrix of the polymer with glass fibers aligned both in a direction perpendicular to the PZT rods and in the third orthogonal direction.

U.S. Pat. No. 4,683,396 discloses an ultrasonic transducer having a piezoelectric composite in which a number of piezoelectric ceramic poles are arranged in a plate-like polymer matrix perpendicular to the plate surface in which the volume ratio of the piezoelectric poles is in a range of 0.15 to 0.75 and the height of each pole is larger than the spacing between adjacent poles.

U.S. Pat. No. 4,726,099 discloses a ceramic polymer matrix composition for use in piezoelectric composites in which the piezoelectric ceramic is a fibrous-like material.

U.S. Pat. No. 4,731,805 discloses an ultrasonic transducer having air in the spaces between the piezoelectric posts with the air spaces between the posts being kept to a minimum resulting in high volume-fill of the piezoelectric material.

U.S. Pat. No. 4,728,845 discloses a piezoelectric composite of 1-3-0 connectivity having a void within the polymer matrix which isolates the lateral sides of the piezoelectric rods from pressures transverse to the axes of the rods.

It is generally the objective of the foregoing art to provide piezoelectric materials with easily compressible, low density construction resulting in low acoustic impedance, so that they can be used in the construction of transducers and hydrophones. The attainment of low density and high compliance is one which has not yet been adequately addressed by the developments of the art.

SUMMARY OF THE INVENTION

The present invention provides a ferroelectric ceramic transducer having low density, high compliance and improved electrical properties. These desirable characteristics are achieved by the preparation of a ferroelectric ceramic transducer with an air-filled kerf.

A ferroelectric transducer element, constructed in accordance with the present invention, includes a plurality of ferroelectric ceramic posts spaced apart with no intervening solid or liquid material between the lateral surfaces of the posts. Each of the posts has a first end and a second end and the total volume of the plurality of posts themselves is no greater than sixty percent of the entire volume of the space defined by the plurality of posts. First electrode layer means electrically connect the first ends of the ferroelectric ceramic posts together and second electrode layer means electrically connect the second ends of the ferroelectric ceramic posts together. A polymer front layer is attached to the first electrode layer means and a polymer back layer is attached to the second electrode layer means. Each of the polymer layers has a shear wavelength at the nominal center operating frequency of the transducer element which is at least three times as large as the shortest distance between the lateral surfaces of neighboring ferroelectric ceramic posts.

The ferroelectric transducer element just described can function by itself as a transducer or can be one of a number of such transducer elements arranged in an array which makes up a transducer.

DETAILED DESCRIPTION OF THE INVENTION

Practically all piezoelectric composite materials used for making thickness mode transducers have a 1-3 connectivity structure with posts which are narrow with respect to their height. These posts are made from a suitable piezoelectric ceramic, such as lead zirconate titanate (PZT), lead titanate or lead metaniobate or a suitable relaxor ferroelectric material, such as PMN/PT, can be used. The same materials can be used in the present invention, although the present invention is not limited by the types of ferroelectric ceramic which are described.

The art suggests that these composites perform as superior piezoelectric units: because a polymer is bonded to the sides of the ceramic posts. The polymer is considerably less dense and more compliant than the ceramic. When sound waves strike the composite, the polymer is more easily displaced than the ceramic. Since the materials are bonded together, and the spacing is short with respect to the acoustic wavelength, the limitation on the compression of the filler is the ceramic post. Thus, the energy is transmitted into the post where it can be converted to electrical energy and removed as a signal via the electrodes. The art is replete with examples of attempts to modify the composition and structure of the ceramic polymeric matrix in attempts to optimize performance for intended applications. Representative examples of such attempts are those disclosed in U.S. Pat. Nos. 4,613,784; 4,412,148; 4,683,396; 4,371,805; 4,728,845; 4,628,223; 4,726,099; 4,671,293; 4,640,291; 4,572,981; and 4,518,889. The disclosures of the foregoing patents are incorporated herein by reference.

In practice, a transducer is always used in conjunction with additional supporting structures. It, therefore, is feasible to prepare a ferroelectric transducer element without any polymeric filler. In this invention, the filler becomes unnecessary since the forces on the outside layers and electrodes are transmitted directly to the posts.

Figure 1:
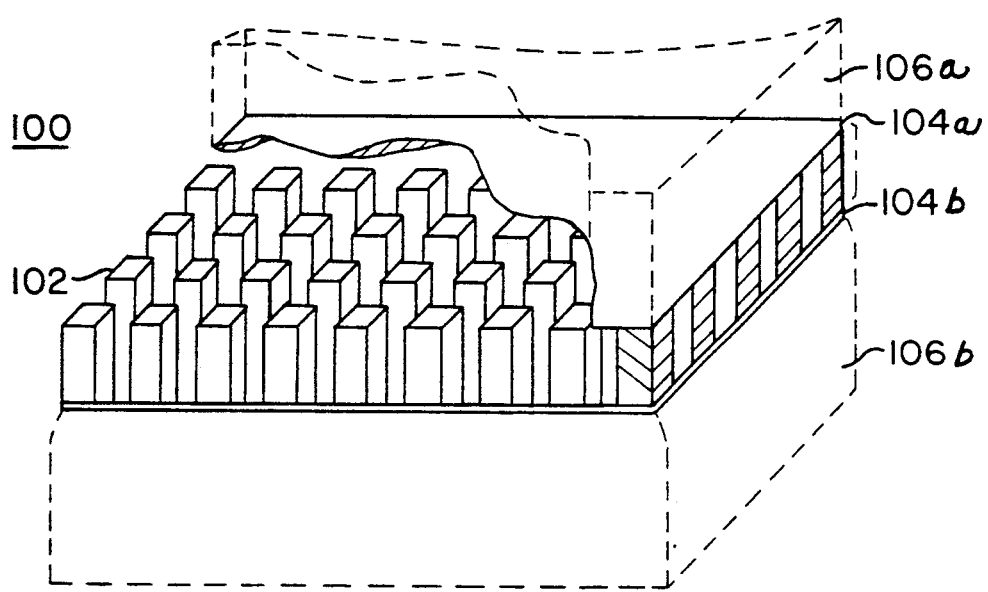
FIG. 1 is a perspective view, partially broken away, of a ferroelectric transducer element constructed in accordance with the present invention.
Figure 2:
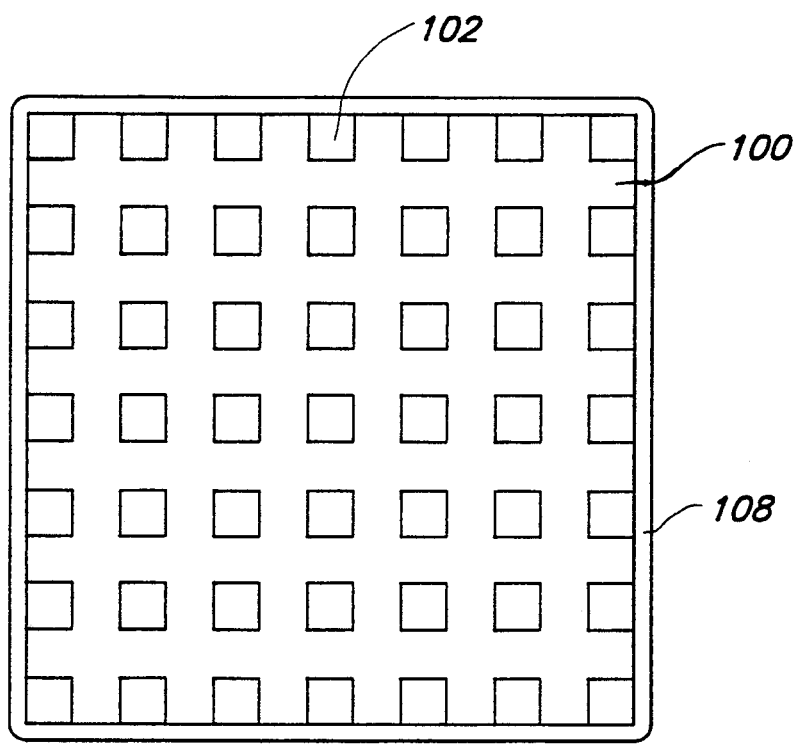
FIG. 2 is a horizontal sectional view of the FIG. 1 ferroelectric transducer element.

Referring now to FIGS. 1 and 2, a ferroelectric transducer element 100, constructed in accordance with the present invention, includes a plurality of ferroelectric ceramic posts 102 spaced apart with no intervening solid or liquid material between the lateral surfaces of the posts. The spaces between posts 102 can be filled with air or, if desired, evacuated to form a vacuum.

Ferroelectric transducer element 100 also includes first electrode layer means 104a and second electrode layer means 104b. Electrode layer means 104a are electrically connected to the first (i.e. upper) ends of posts 102 to electrically connect the first ends of posts 102 together and electrode layer means 104b are electrically connected to the second (i.e. lower) ends of posts 102 to electrically connect the second ends of posts 102 together.

Ferroelectric transducer element 100 further includes a polymer front layer 106a and a polymer back layer 106b. Front layer 106a is attached to electrode layer means 104a and back layer 106b is attached to electrode layer means 104b. By characterizing front layer 106a and back layer 106b as "polymer" layers, it is intended to include layers which are pure polymers and layers which are polymers filled with ceramic, metal, metal oxide and the like powders or microballoons.

The electrode layer means 104a and 104b can be single layers, as shown, or multi-layers at the ends of posts 102. As shown, each electrode layer means includes a single layer to which polymer front layer 106a or polymer back layer 106b is attached. As an alternative, each post 102 can have a second electrode layer at each end disposed between the end of the ceramic material and the electrode layer to which the polymer layer is attached.

Figure 3:
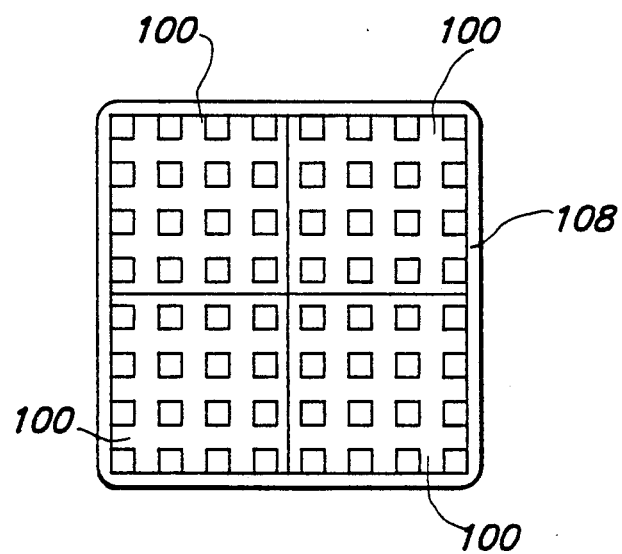
FIG. 3 is a horizontal sectional view of an array of ferroelectric transducer elements constructed in accordance with the present invention.

Usually the sides of the transducer element will be sealed when the element functions as a transducer by itself. Such sealing means can be an O-ring or a polymeric layer 108, shown in FIG. 2 but not shown in FIG. 1, which extends around the lateral sides of the space defined by the plurality of posts. When the ferroelectric transducer element is but one part of an array of transducer elements positioned side-by-side, such as the four-element array illustrated in FIG. 3, the sealing means can be arranged to seal the array as a whole, rather than sealing each individual transducer element within the array.

This new construction, just described, is referred to herein as an air kerf composite because the posts are separated from each other only by air. As used herein, the term "kerf" refers to the space between the ceramic posts.

In accordance with the present invention, the total volume of the plurality of posts 102 themselves is no greater than sixty percent of the entire volume of the space defined by the plurality of posts. The preferred volume-fill of ceramic is determined by the specific design requirements. Low volume-fill is desirable for obtaining low acoustic impedance, but, in some cases, high volume-fill might be preferable for obtaining low electrical impedance. In applications where a volume-fill of less than twenty percent results in acceptable electrical impedance, the present invention provides added benefit over 1-3 ceramic polymer composites in that the pressure in the polymer front layer and polymer back layer is entirely applied to the ceramic posts, rather than being distributed over both ceramic posts and intervening polymer material. This improves the operation of the transducer because all of the incident energy enters the posts resulting in improved conversion efficiency.

A related characteristic is that the polymer front layer and polymer back layer each have a shear wavelength at the nominal center operating frequency of the transducer element which is at least three times as large as the shortest distance between the lateral surfaces of neighboring posts.

Ceramic posts 102 can be in the form of rods, bars, or the like and can have various cross-sections. In one preferred form of the present invention, the length of each post 102 is one-half of the wavelength of the nominal center operating frequency of ferroelectric ceramic transducer element 100. In a second preferred form of the present invention, the length of each post 102 is one-quarter of the wavelength of the nominal center operating frequency of ferroelectric ceramic transducer element 100.

Electrode layer means 104a and 104b can be made from any suitable metal, such as gold, silver, nickel, chrome or an alloy of palladium and silver, arranged in single or multiple layers as described previously.

Front layer 106a and back layer 106b can be made from any suitable polymer, such as an epoxy, with or without a filler as described previously. When the length of posts 102 is one-half of the wavelength of the nominal center operating frequency of the transducer element, polymer back layer 106b is arranged to have an acoustic impedance which is lower than the acoustic impedance of the transducer element. When the length of posts 102 is one-quarter of the wavelength of the nominal center operating frequency of the transducer element, polymer back layer 106b is arranged to have an acoustic impedance which is higher than the acoustic impedance of the transducer element. In addition, the acoustic impedance of polymer front layer 106a preferably is within the range between the composite acoustic impedance of ferroelectric transducer element 100 and the acoustic impedance of the medium into which transmissions from the transducer element are propagated or from which transmissions are received by the transducer element.

One advantage associated with the air kerf composite, just described, is that post-to-post isolation will be a function of the surface waves on the front and rear surfaces, as opposed to waves traveling through the filler material. This will lead to better suppression of lateral modes depending on the selection of the layer materials.

The air kerf composite shows an absence of shear resonance, full pressure transfer to the ceramic, zero lateral clamping, and vastly reduced lateral coupling, as opposed to the polymeric ceramic piezoelectrics.

Other embodiments and modifications of the present invention will be apparent to those skilled in the art upon review of the present invention. Therefore, it is understood that the present invention is not limited by the teachings herein presented and that further embodiments and modifications not specifically delineated herein are included within the scope of the claims.

I claim:

1. A ferroelectric transducer element comprising:
   a plurality of ferroelectric ceramic posts spaced apart with no intervening solid or liquid material between the lateral surfaces of said posts, each of said posts having a first end and a second end and the total volume of said plurality of posts themselves being no greater than sixty percent of the entire volume of the space defined by said plurality of posts;

first electrode layer means for electrically connecting said first ends of said posts together;

second electrode layer means for electrically connecting said second ends of said posts together;

a polymer front layer attached to said first electrode layer means and having a shear wavelength at the nominal center operating frequency of said transducer element which is at least three times as large as the shortest distance between the lateral surfaces of neighboring posts;

and a polymer back layer attached to said second electrode layer means and having a shear wavelength at the nominal center operating frequency of said transducer element which is at least three times as large as the shortest distance between the lateral surfaces of neighboring posts.

2. A ferroelectric transducer element according to claim 1 wherein:
(a) the acoustic impedance of said polymer back layer is lower than the composite acoustic impedance of said transducer element, and
(b) the length of each of said posts is one-half of the wavelength of the nominal center operating frequency of said transducer element.

3. A ferroelectric transducer element according to claim 1 wherein:
(a) the acoustic impedance of said polymer back layer is higher than the composite acoustic impedance of said transducer element, and
(b) the length of each of said posts is one-quarter of the wavelength of the nominal center operating frequency of said transducer element.

4. A ferroelectric transducer element according to claim 2 wherein the acoustic impedance of said polymer front layer is within the range between the composite acoustic impedance of said transducer element and the acoustic impedance of the medium into which transmissions from said transducer are propagated or from which transmissions are received by said transducer.

5. A ferroelectric transducer element according to claim 3 wherein the acoustic impedance of said polymer front layer is within the range between the composite acoustic impedance of said transducer element and the acoustic impedance of the medium into which transmissions from said transducer are propagated or from which transmissions are received by said transducer.

6. A ferroelectric transducer element according to claim 1 further including means extending around the lateral sides of said space defined by said plurality of posts for sealing said space defined by said plurality of posts.

7. A ferroelectric transducer element according to claim 4 further including means extending around the lateral sides of said space defined by said plurality of posts for sealing said space defined by said plurality of posts.

8. A ferroelectric transducer element according to claim 5 further including means extending around the lateral sides of said space defined by said plurality of posts for sealing said space defined by said plurality of posts.

9. A ferroelectric transducer element according to claim 6 wherein said posts are formed from a piezoelectric material.

10. A ferroelectric transducer element according to claim 9 wherein said posts are formed from a piezoelectric material selected from the group consisting of lead zirconate titanate, lead titanate and lead metaniobate.

11. A ferroelectric transducer element according to claim 10 wherein said electrode layer means are formed from a material selected from the group consisting of gold, silver, nickel, chrome and an alloy of palladium and silver.

12. A ferroelectric transducer element according to claim 6 wherein said posts are formed from a relaxor ferroelectric material.

13. A ferroelectric transducer element according to claim 12 wherein said relaxor ferroelectric material is PMN/PT.

14. A ferroelectric transducer element according to claim 13 wherein said electrode layer means are formed from a material selected from the group consisting of gold, silver, nickel, chrome and an alloy of palladium and silver.

15. A ferroelectric transducer array comprising:
a plurality of ferroelectric transducer elements positioned side-by-side to form an array of said elements, each of said ferroelectric transducer elements having:
(a) a plurality of ferroelectric ceramic posts spaced apart with no intervening solid or liquid material between the lateral surfaces of said posts, each of said posts having a first end and a second end and the total volume of said plurality of posts themselves being no greater than sixty percent of the entire volume of the space defined by said plurality of posts;
(b) first electrode layer means for electrically connecting said first ends of said posts together;
(c) second electrode layer means for electrically connecting said second ends of said posts together;
(d) a polymer front layer attached to said first electrode layer means and having a shear wavelength at the nominal center operating frequency of said transducer element which is at least three times as large as the shortest distance between the lateral surfaces of neighboring posts;
(e) and a polymer back layer attached to said second electrode layer means and having a shear wavelength at the nominal center operating frequency of said transducer element which is at least three times as large as the shortest distance between the lateral surfaces of neighboring posts.

16. A ferroelectric transducer array according to claim 15 wherein said posts are formed from a piezoelectric material.

17. A ferroelectric transducer array according to claim 16 further including means extending around the lateral sides of said array of ferroelectric transducer elements for sealing said array.

18. A ferroelectric transducer array according to claim 15 wherein said posts are formed from a relaxor ferroelectric material.

19. A ferroelectric transducer array according to claim 18 further including means extending around the lateral sides of said array of ferroelectric transducer elements for sealing said array.

* * * * *